United States Patent [19]
Ferraiolo et al.

[11] Patent Number: 5,838,205
[45] Date of Patent: Nov. 17, 1998

[54] VARIABLE-SPEED PHASE-LOCKED LOOP SYSTEM WITH ON-THE-FLY SWITCHING AND METHOD THEREFOR

[75] Inventors: Frank David Ferraiolo, Essex Junction; John Edwin Gersbach, Burlington; Charles Joseph Masenas, Essex Junction, all of Vt.

[73] Assignee: International Business Machines Corporation, Armonk, N.Y.

[21] Appl. No.: 801,546

[22] Filed: Feb. 18, 1997

[51] Int. Cl.[6] ........................................ H03L 7/07
[52] U.S. Cl. ................... 331/2; 331/11; 327/147; 327/156
[58] Field of Search ................... 331/2, 11, 17; 327/99, 156, 147

[56] References Cited

U.S. PATENT DOCUMENTS

| | | | |
|---|---|---|---|
| 4,358,741 | 11/1982 | Nardin | 331/2 |
| 4,365,211 | 12/1982 | Lee | 331/11 |
| 4,388,597 | 6/1983 | Bickley, et al. | 331/2 |
| 4,511,859 | 4/1985 | Dombrowski | 331/11 |
| 4,868,513 | 9/1989 | Piercy, et al. | 328/134 |
| 4,963,838 | 10/1990 | Hareyama | 331/2 |
| 5,095,280 | 3/1992 | Wunner, et al. | 328/63 |
| 5,150,078 | 9/1992 | Yang, et al. | 331/2 |
| 5,197,126 | 3/1993 | Harrell | 395/200 |
| 5,317,284 | 5/1994 | Yang | 331/2 |
| 5,332,978 | 7/1994 | Yabuki, et al. | 331/2 |
| 5,572,167 | 11/1996 | Alder et al. | 331/17 |

*Primary Examiner*—Son T. Dinh
*Attorney, Agent, or Firm*—Schmeiser, Olsen & Watts; Eugene I. Shkurko

[57] ABSTRACT

According to the preferred embodiment, a phase-locked loop system is provided that overcomes the limitations of the prior art by providing the ability to switch output frequencies without a disruption in the phase lock of the output signal. The system uses a first phase-locked loop coupled with a second phase lock-loop such that their output signals are phase aligned and a switching mechanism for switching between the first phase lock output signal and the second phase lock loop output signal. The system is thus able to switch the frequency of its output without a disruption in the phase-lock of the signal.

14 Claims, 3 Drawing Sheets

VARIABLE-SPEED PHASE-LOCKED LOOP SYSTEM WITH ON-THE-FLY SWITCHING AND METHOD THEREFOR

BACKGROUND OF THE INVENTION

1. Technical Field

This invention generally relates to semiconductor devices, and more specifically relates to phase-locked loops.

2. Background Art

Phase-locked loops (PLLs) are used a wide variety of applications in semiconductor devices. For example, PLLs are used in clock generators, frequency multipliers, frequency synthesizers and servo systems in disk drives. Naturally, in all of these and other applications the accuracy and reliability of the PLL is of critical importance.

Turning to FIG. 1, FIG. 1 is a schematic view of a prior-art phase-locked loop 100. PLL 100 comprises a phase detector 102, a charge pump 104, a filter 106, a voltage-controlled oscillator (VCO) 110, and a feedback divider 114.

The general operation of PLL's is well known, so only a brief explanation will be given. Phase detector 102 compares an input signal to a feedback signal from feedback divider 114. Depending upon the phase difference between the input signal and feedback signal, the phase detector drives charge pump 104. The output of charge pump 104 is filtered by filter 106, and is used to drive the VCO 110. The VCO 110 comprises a voltage-to-current (V-toI) converter and a current controlled oscillator (ICO). Thus, the VCO 110 receives a voltage at its input and outputs a signal with a frequency proportional to that signal. Of course, those skilled in the art will recognize that this description of the VCO 110 is for illustration purposes and that the VCO 110 could be illustrated as separate voltage-to-current converter and current-controlled oscillator rather than as a single element.

The output of VCO 110 is fed back through feedback divider 114 to phase detector 102. The feedback divider 114 divides down the output signal frequency to match the input signal frequency so they can be phase compared. Thus, the signal path through the feedback divider to the phase detector 102 creates the feedback that facilitates the phase-locked loop operation.

Several PLL applications require the ability to be able to switch the PLL output frequency during operation. The frequency at which the phase-locked loop 100 operates is dependent upon the frequency of the VCO 110 and the amount of division by the feedback divider 114. To change the output frequency one or both of these elements may be adjusted. Unfortunately, adjusting these elements while the PLL is running causes the phase lock to be lost until the PLL locks again. This delay in locking can be unacceptable for applications that require a phase lock to be maintained during switching.

Therefore, there existed a need to provide an improved PLL that can switch from one output frequency to another without a disruption in phase lock.

DISCLOSURE OF INVENTION

According to the present invention, a phase-locked loop system is provided that overcomes the limitations of the prior art by providing the ability to switch output frequencies without a disruption in the phase lock of the output signal. The system uses a first phase-locked loop coupled with a second phase-locked loop such that their output signals are phase-aligned and a switching mechanism for switching between the first phase-locked loop output signal and the second phase-locked loop output signal. The system is thus able to switch the frequency of its output without a disruption in the phase-lock of the signal.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Many common semiconductors, such as microprocessors, are designed to operate in a wide range of operating conditions. For example, a typical microprocessor used as a CPU in a personal computer is typically designed to operate from below freezing to well above a hundred degrees F. In order to assure proper operation in these extreme conditions, the semiconductor device is usually configured to operate well below its maximum speed at normal conditions. This allows the device to continue to operate within tolerance as the temperature increases or decreases to the extreme of the operating range.

While this arrangement works, it is less than ideal. The fact is that many devices operate almost exclusively in conditions that are in the middle of their specified operating temperature range (i.e., the temperature controlled office). Thus, these devices could effectively run the majority of the time at a much higher speed than they are configured for. Unfortunately, this would result in the device being possibly inoperable if and when conditions change greatly.

One solution to the problem is to dynamically adjust the speed of the semiconductor device as conditions change. For example, a microprocessor could be designed to operate at near maximum speed at room temperature and to automatically switch to a lower operating speed if and when the temperature changes. One apparatus and method for determining if and when a device is approaching maximum operating speed and when there is sufficient margin to increase speed is disclosed in copending application by Ferraiolo et al. titled "Self-Timed Circuit Having Critical Path Timing Detection," Ser. No. 08/694,120, filed on Aug. 8, 1996 and assigned to International Business Machines Corp. This solution provides fast operation in ideal conditions without compromising reliability at extreme conditions.

One problem in switching operating speed has been the prior inability to switch on the fly without a disruption in the operation of the device. For example, semiconductor devices that use phase-locked loops as clock generators cannot have their speed switched without a loss of the clock system phase lock. This inability requires a device to essentially be shut down and restarted each time the operating speed is changed.

Figure 1:
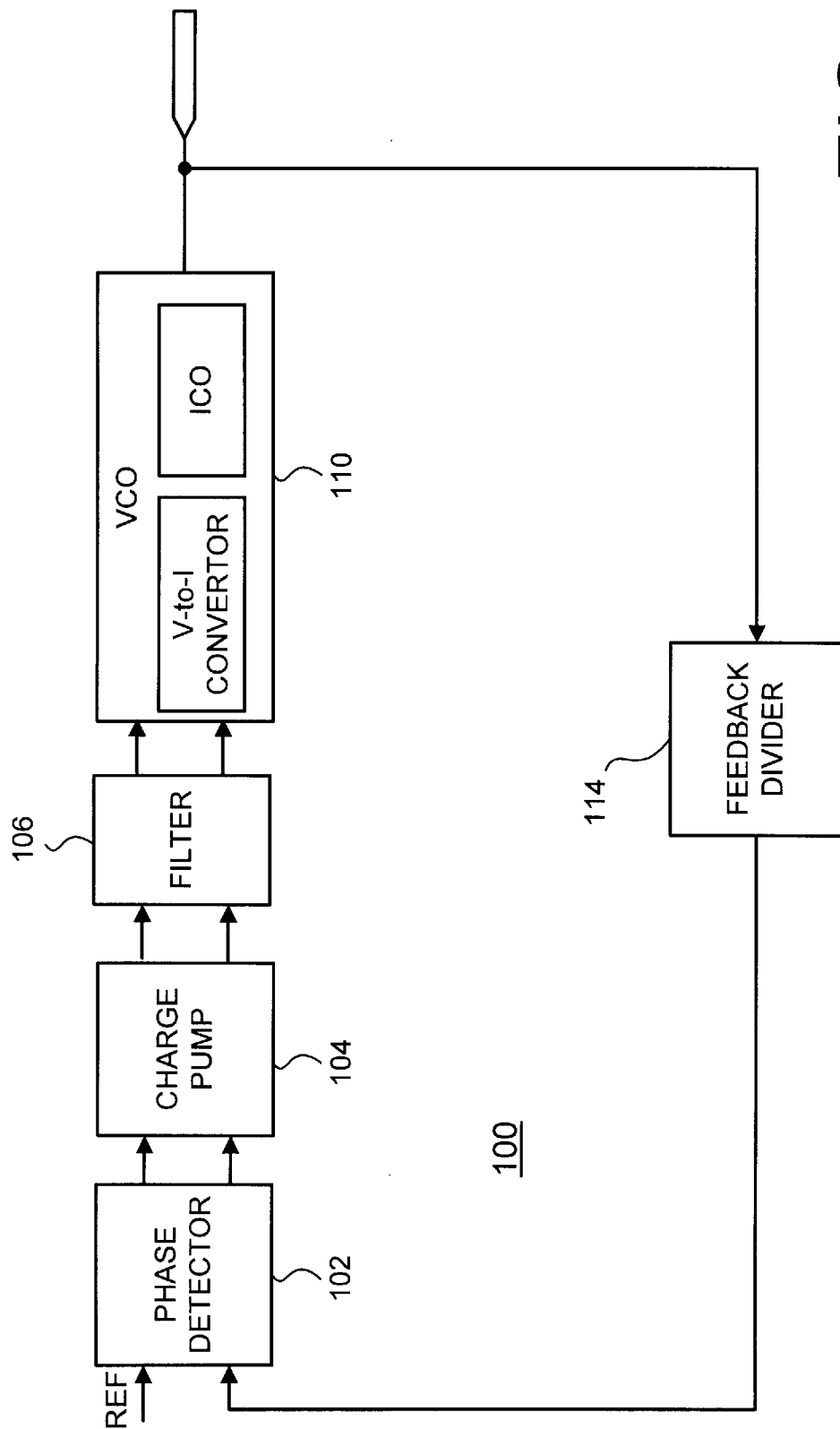
FIG. 1 is a schematic view of a prior art phase-locked loop device.
Figure 2:
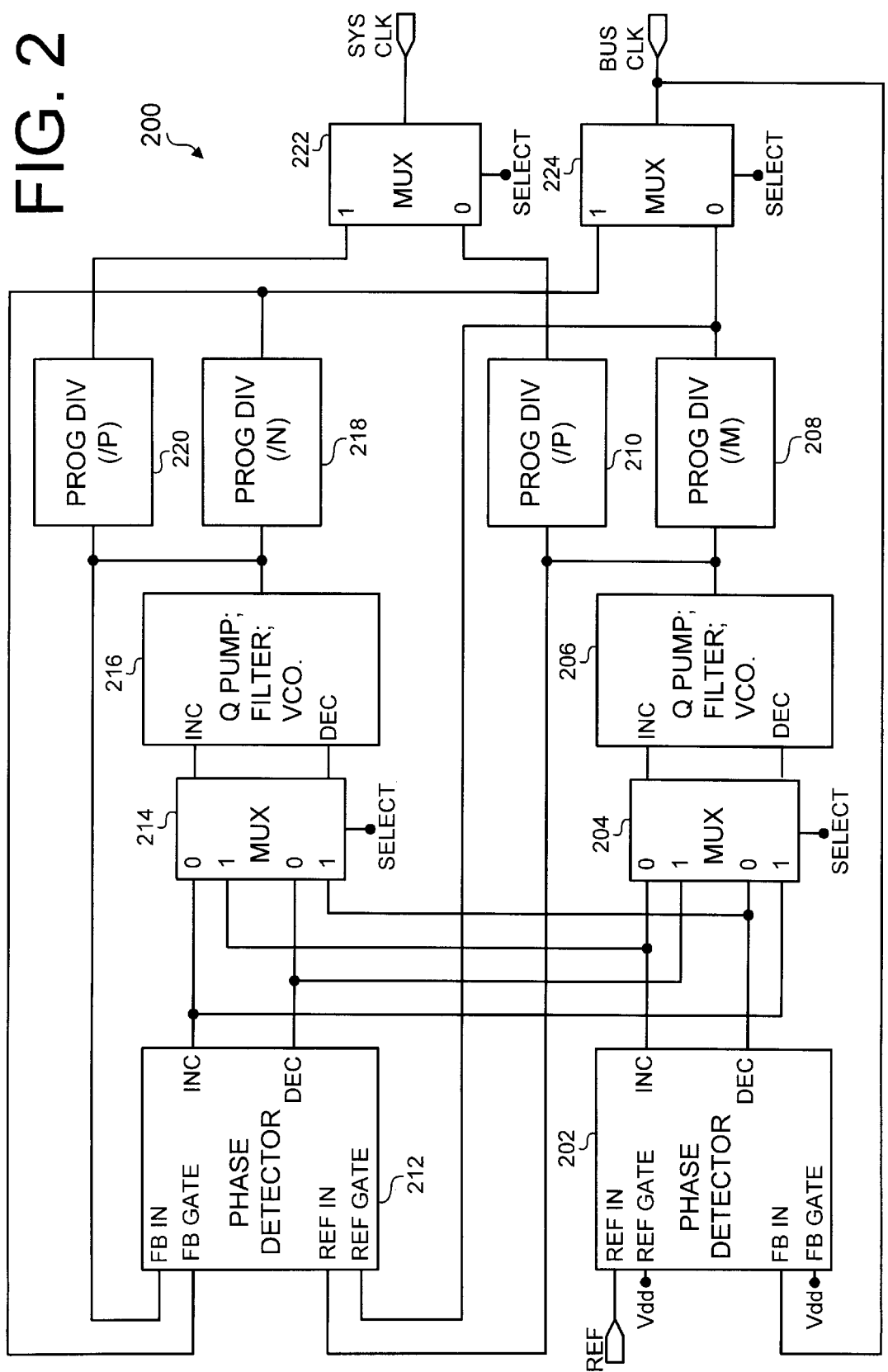
FIG. 2 is a schematic view of a variable-speed phase-locked loop device in accordance with the preferred embodiment.

A variable-speed phase-locked loop system (PLL) in accordance with the present invention overcomes the limitations of the prior art by providing a way to instantaneously change the output frequency of the PLL system while maintaining phase lock. Referring to FIG. 2, a variable-speed PLL system 200 in accordance with a first preferred embodiment is illustrated schematically. The PLL system 200 can be used in a processing system to allow a processor to switch from a first clock speed to a second clock speed without disruption. The PLL system 200 includes two PLL's interleaved together. The first PLL includes a first phase detector 202, a first charge pump/filter/voltage control oscillator (VCO) 206, a programmable frequency divider 208 and a programmable frequency divider 210. The first PLL operates as a first variable-speed clock generator to provide a clock signal with a selectable frequency. The second PLL includes a second phase detector 212, a second charge pump/filter/VCO 216, a programmable frequency divider 218 and a programmable frequency divider 220. The second PLL operates as a second variable-speed clock generator to provide a second clock signal with a selectable frequency. Furthermore, the PLL system 200 includes multiplexers 204, 214, 222 and 224. These multiplexers serve as a switching mechanism for switching an output of the PLL system 200 from the first clock signal to the second clock signal and vice versa. Thus, where used in a processing system, the clock speed of the processing system can be switched.

Phase detectors 202 and 212 compare the edge alignment of a reference signal (REF IN) and a feedback signal (FB IN) when a reference gate (REF GATE) and a feedback gate (FB GATE) signal are both high. Phase detectors 202 and 212 then output a pulse at either an increment output (INC) or a decrement output (DEC) depending upon the direction of the detected phase difference.

Multiplexers 204, 214, 222 and 224 each receive a plurality of inputs and pass to an output one of those inputs depending upon the state of a select signal. Thus when the select signals are low the "0" inputs are passed to the output and when the select signals are high the "1" inputs are passed to the output. Of course, the multiplexers can be replaced with any other appropriate logic or other switching mechanism.

Charge pump/filter/VCO 206 and 216 (hereinafter VCO 206 and VCO 216 respectively) are preferably standard PLL elements illustrated together for clarity. They receive outputs from phase detectors 202 and 212 and through multiplexers 204 and 214 and output an oscillating signal with a frequency responsive to its inputs.

The programmable frequency dividers 208, 210, 218 and 220 each receive an input signal and output a signal having a frequency divided down by a selected amount. In particular, programmable frequency divider 208 divides the frequency by a selectable integer M, programmable frequency divider 218 divides the frequency by a selectable integer N, and programmable frequency dividers 210 and 220 divide the frequency by a selectable integer P. In the preferred embodiment programmable frequency dividers 208 and 218 comprise dividers that go high every N cycles for a period equal to one high speed clock cycle. In contrast, programmable frequency dividers 210 and 220 are preferably dividers with an output signal having a 50% duty cycle.

PLL system 200 receives an input REF and has two outputs, labeled BUS CLK and SYS CLK. As will become clear, the BUS CLK signal will always be in phase alignment with and have a frequency equal to the REF signal when the PLL system 200 is in operation. The SYS CLK signal will have a frequency equal to REF times M divided by P when the multiplexer select signals are low. Likewise, the SYS CLK signal will have a frequency equal to REF times N divided by P when the multiplexer select signals are high. Thus, by selecting appropriate values for M, N and P, the SYS CLK signal frequency can be selectably determined.

The operation of PLL system 200 is as follows. Assume that multiplexers j204, 214, 222 and 224 are selected to pass their "0" inputs and PLL system 200 has been operating sufficiently long enough to achieve lock. With the multiplexers selected to pass their "0" inputs, phase detector 202 outputs to VCO 206 through multiplexer 204 and phase detector 212 likewise outputs to VCO 216 through multiplexer 214. Phase detector 202 receives the REF signal in REF IN and the BUS CLK signal in FB IN. Because REF GATE and FB GATE are both tied high (i.e., to Vdd), phase detector 202 will compare the phase of the REF signal with the BUS CLK signal during each clock cycle and will output an appropriate INC signal or DEC signal depending on the nature of any detected phase difference. The INC and DEC signals are passed to VCO 206, where they drive the VCO 206 to provide an output signal with a frequency that drives the PLL to phase lock.

The VCO 206 output signal is frequency divided down by an integer M by programmable divider 208. The output of programmable divider 208 is passed through multiplexer 224 to the BUS CLK output, where it is also fed back to the FB IN input of phase detector 202. The signal path from the BUS CLK output to the phase detector 202 creates the feedback that facilitates the well-known PLL action. In particular, the phase detector 202 will drive the charge pump/filter/VCO 206 to output a signal in phase with the REF signal and having a frequency equal to the REF signal frequency times the integer M. That signal is frequency divided down by an integer M by programmable divider 208 and passed to the BUS CLK output. Thus, the BUS CLK output is a signal phase aligned with and having the same frequency as the REF signal.

The VCO 206 output is also passed to programmable divider 210 where its frequency is divided down by an integer P. The programmable divider 210 output is tied to the SYS CLK output through multiplexer 222. Thus, the SYS CLK output will be a signal having a frequency equal to the VCO 206 output frequency divided by the integer P. Thus, the SYS CLK frequency is equal to the REF signal frequency, times integer M and divided by integer P. Furthermore, the SYS CLK signal will be phase-aligned with the REF (and hence the BUS CLK). Because the SYS CLK and REF have different frequencies where M and P are different numbers, "phase alignment" means they are only periodically phase aligned.

With multiplexers 222 and 224 selected to pass their "0" inputs the first PLL provides the PLL system 200 outputs. Thus, PLL system 200 outputs a BUS CLK signal in frequency and phase alignment with the REF signal and a SYS CLK signal also phased aligned with the REF signal and a frequency equal to the REF frequency times M divided by P. Thus, by selecting appropriate values for M and P the output frequency of the SYS CLK signal can be determined.

At the same time, the second PLL, in particular phase detector 212, receives the VCO 216 output in FB IN and the VCO 206 output at REF IN. Phase detector 212 further receives the programmable divider 218 output in FB GATE and the programmable divider 208 output in REF GATE.

When the REF GATE and FB GATE inputs are high, the rising edge of the VCO's for that cycle are phase aligned., and the phase detector 212 will compare the phase of the VCO 216 output with the phase of the VCO 206 output. This occurs every M cycles of the VCO 206 output and every N cycles of the VCO 216 output.

Phase detector 212 will output an appropriate INC signal or DEC signal depending on the nature of any detected phase difference. The INC and DEC signals are passed to VCO 216. The VCO 216 output is connected back to the FB IN input of phase detector 212. With the VCO 206 output likewise connected to the REF IN input the phase-locked loop action drives the VCO 216 to provide an output signal that will cause the VCO 216 output to be phase aligned with the VCO 206 output every M output cycles of VCO 206 and every N output cycles of VCO 216. This causes the programmable divider 218 output to be both frequency and phase aligned with the programmable divider 208 output. Hence, the programmable divider 218 output will be frequency and phase aligned with the REF input signal and the BUS CLK output signal.

Because the VCO 216 output is driven to provide a programmable divider 218 output that is frequency and phase aligned with the REF signal, the VCO 216 output will have a frequency equal to the REF signal frequency times the integer N and will be phased aligned with the REF signal.

Likewise, the VCO 216 output signal is frequency divided down by an integer P by programmable divider 220. Thus, the programmable divider 208 output has a frequency equal to the REF signal frequency times the integer M divided by the integer P and is phased aligned with the REF signal.

Thus, with the multiplexers 204, 214, 222 and 224 selected to pass their "0" inputs the phase detector 202, VCO 206, programmable divider 208 and programmable divider 210 comprise the active PLL, with its outputs tied to the BUS CLK and SYS CLK outputs. The BUS CLK output is frequency and phase aligned with the REF signal. Likewise, the SYS CLK signal is equal to the REF signal times integer M and divided by integer P and is phased aligned with the REF signal. The phase detector 212, VCO 216, programmable divider 218 and programmable divider 220 now comprise the standby PLL, with its programmable divider 218 output driven to be frequency and phase aligned with the corresponding active PLL output (programmable divider 208 output) but with the outputs disconnected from the BUS CLK and SYS CLK outputs.

When it is desired to switch the SYS CLK frequency, the multiplexers 204, 214, 222 and 224 are all simultaneously switched to pass their "1" inputs. As will become clear, the switch causes the SYS CLK output frequency to switch from REF times M divided by P to REF times N divided by P without affecting the BUS CLK output.

Preferably, the switch is made when the REF signal, the programmable divider 210 and programmable divider 220 outputs are phase aligned, which occurs every N cycles of VCO 216 and every M cycles of VCO 206. If the switch is made when the signals are phase aligned and is done in one clock cycle, the SYS CLK frequency will switch without a loss of phase lock and without a disruption of the SYS CLK phase alignment.

In particular, switching multiplexer 224 causes the programmable divider 218 output to be delivered to the BUS CLK output in place of the programmable divider 208 output. Of course, the programmable divider 218 was frequency and phase aligned with the programmable divider output 208 before the switch so the BUS CLK signal is unchanged.

Switching multiplexer 222 causes the programmable divider 220 output to be delivered to the SYS CLK output in place of the programmable divider 210 output. This causes the SYS CLK frequency to switch from REF times M divided by P to REF times N divided by P. Because the switching was done on a clock cycle where the programmable divider 210 output was in phase with the programmable divider 220 output, the SYS CLK frequency is switched without a disruption in the phase lock of the SYS CLK signal. Where the SYS CLK is used as a processor system clock, this allows the processor to switch clock speeds and continue operating uninterrupted at the new speed.

Switching multiplexers 204 and 214 causes the INC and DEC outputs of phase detector 202 to be inputted to the INC and DEC inputs respectively of VCO 216. Similarly, the INC and DEC outputs of phase detector 212 are inputted to the DEC and INC inputs respectively of VCO 216. The INC and DEC inputs are reversed for phase detector 212/VCO 216 to compensate for the reversal of the FB IN input and the REF IN input of phase detector 212.

With the multiplexers 204, 214, 222 and 224 switched, phase detector 202 drives VCO 216 to output a signal which causes the programmable divider 218 output, which is now the BUS CLK output, to be frequency and phase aligned with the REF signal. Of course this is the same frequency/phase combination that VCO 216 was being driven to by phase detector 212 and thus the programmable divider 218 output and the BUS CLK output stays unchanged. The same feedback action also maintains the programmable divider 220 output with a frequency equal to REF times N divided by P.

Likewise, the phase detector 212 drives VCO 206 to output a signal which causes the programmable divider 208 output to be frequency and phase aligned with the programmable divider 218 output. Of course this is the same frequency/phase combination that VCO 206 was being driven to by phase detector 202 and thus there is no change in the programmable divider 208 output.

Thus, switching the multiplexers causes phase detector 202, VCO 216, programmable divider 218 and programmable divider 220 to comprise the active PLL, with its outputs tied to the BUS CLK and SYS CLK outputs. The phase detector 212, VCO 206, programmable divider 208 and programmable divider 218 now comprise the standby PLL, with its programmable divider 208 output driven to be frequency and phase aligned with the corresponding active PLL output (programmable divider 218 output) but with the outputs disconnected from the BUS CLK and SYS CLK outputs.

With the programmable divider 208 output disconnected from the BUS CLK output and the programmable divider 210 output disconnected from the SYS CLK output, the programmable divider 208 can now be reprogrammed. In particular, the BUS CLK and SYS CLK outputs are now being driven by programmable divider 218 and 220 respectively and the integer M of programmable divider 218 changed without a disruption in the BUS CLK output signal and the SYS CLK output signal.

After reprogramming programmable divider 208 the multiplexers 204, 214, 222 and 224 can be switched back to passing their "0" inputs, causing the SYS CLK frequency to change to a new frequency (equal to REF times the new M divided by P) while once again maintaining phase lock and while maintaining the frequency and phase of the BUS CLK signal. Switching the multiplexers back to "0" thus causes the phase detector 202, VCO 206, programmable divider 208 and programmable divider 218 to once again comprise the active PLL, with the programmable divider 208 connected to BUS CLK and the programmable divider 210 connected to the SYS CLK. Likewise, phase detector 212, VCO 216, programmable divider 218 and programmable divider 220 once again comprises the standby PLL.

Programmable divider 218 can then be reprogrammed (i.e., the integer N changed), and the switch made again. Thus, you can change the SYS CLK frequency from one frequency to another by switching the multiplexers, reprogramming the standby programmable divider and switching the multiplexers back. This is all done without a disruption in the phase of the SYS CLK signal and while still providing a frequency and phase aligned BUS CLK signal. This system thus allows a system, such as a computer system, to be switched from one operating frequency to another operating frequency without disruption to the system processor. Furthermore, the system provides a second clock signal with a fixed frequency that is phase aligned with the frequency switchable clock signal.

Figure 3:
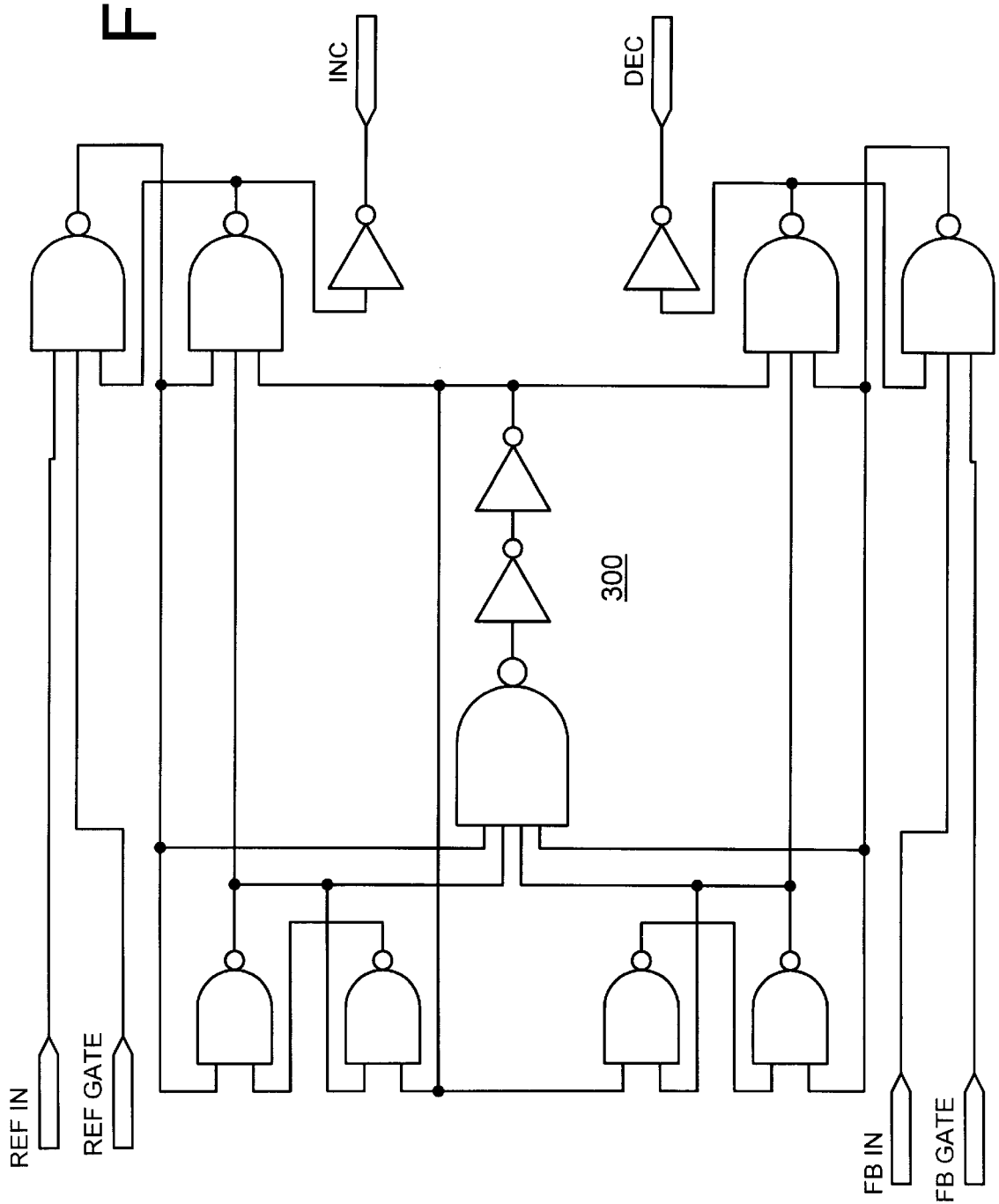
FIG. 3 is a schematic view of a phase detector of FIG. 2 in accordance with the preferred embodiment.

Turning now to FIG. 3, a schematic view of a phase detector 300 is illustrated. The phase detector 300 is the preferred phase detector for use as phase detector 202 and phase detector 212 in the preferred embodiment. Phase detector 300 is a phase/frequency detector, meaning it detects both phase and frequency differences and outputs signals depending upon the detected difference. Those signals are used to drive the VCO to eliminate the phase and frequency difference.

Thus, a PLL system is provided that can dynamically switch from one output frequency to another without a disruption in the phase lock of the signal. The PLL system can be used wherever a need exists to switch frequencies while maintaining phase lock. In particular, the PLL system can be used to provide the system clock and bus clock of a microprocessor. The PLL system can then be used to, for example, raise or lower the system clock frequency in response to changing environmental conditions.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

We claim:

1. A phase-locked loop system, said phase-locked loop system providing a system output signal having a frequency and capable of switching said frequency without disrupting the phase lock of said system output signal, said phase-locked loop system comprising:
   a first phase-locked loop, said first phase lock-loop receiving a reference signal and outputting a first phase-locked loop output signal with a first frequency, wherein said first phase-locked loop includes a first oscillator and a first phase detector comparing the phase of said reference signal and a second system output, said first phase detector outputting a first phase difference signal in proportion to a first detected phase difference;
   a second phase-locked loop, said second phase-locked loop output signal receiving said first phase lock-loop output signal and outputting a second phase lock loop signal with a second frequency, wherein said second phase-locked loop includes a second oscillator and a second phase detector comparing the phase of said first oscillator output with the phase of said second oscillator output, said second phase detector outputting a second phase difference signal in proportion to a second detected phase difference; and
   a switching mechanism, said switching mechanism selecting said system output signal from said first phase-locked loop output signal and said second phase-locked loop output signal wherein said system output signal frequency is switched from said first frequency to a second frequency without said disruption in the phase lock of said system output signal.

2. The phase-locked loop system of claim 1 wherein:
said switching mechanism includes a first selecting mechanism and a second selecting mechanism, said first selecting mechanism receiving said first phase difference signal and said second phase difference signal and passing a first selected phase difference signal to said first oscillator and said second selecting mechanism receiving said first phase difference signal and said second phase difference signal and passing a second selected phase difference signal to said second oscillator.

3. The phase-locked loop system of claim 2 further comprising:
   a first frequency divider, said first frequency divider receiving said first signal and outputting a divided first signal;
   a second frequency divider, said second frequency divider receiving said second signal and outputting a divided second signal, wherein said divided first signal comprises said first phase-locked loop output signal and said divided second signal comprises said second phase-locked loop output signal;
   wherein said switching mechanism comprises a third selecting mechanism receiving said divided first signal and said divided second signal and outputting a selected divided signal, wherein said selected divided signal is coupled to said system output.

4. The phase-locked loop system of claim 3 further comprising:
   a third frequency divider, wherein said third frequency divider receives said first signal and outputs a second divided first signal;
   a fourth frequency divider, wherein said fourth frequency divider receives said second signal and outputs a second divided second signal; and
   a fourth selecting mechanism, said fourth selecting mechanism receiving said second divided first signal and said second divided second signal and outputting a second selected divided signal, wherein said second selected divided signal is coupled to a second system output and is further fed back to said first phase detector.

5. The phase-locked loop system of claim 4 wherein said first, second, third and fourth selecting mechanisms comprise multiplexers.

6. The phase-locked loop system of claim 4 wherein said first and second frequency dividers comprise programmable dividers that divide their respective input signals by a programmable integer P, and wherein said third frequency divider comprises a programmable divider that divides its input signal by a programmable integer M and wherein said fourth frequency divider comprises a programmable divider that divides its input signal by a programmable integer N.

7. The phase-locked loop system of claim 2 further comprising:

a first charge pump having an increment input and a decrement input and having a an output coupled to said first oscillator;

a second charge pump having an increment input and a decrement input and having an output coupled said second oscillator;

wherein said first phase detector includes an increment output signal and decrement output signal;

wherein said second phase detector includes an increment output signal and decrement output signal;

wherein said first phase detector increment signal is coupled to said first charge pump increment input through said first selecting mechanism and to said second charge pump increment input through said second selecting mechanism and wherein said first phase detector decrement signal is coupled to said first charge pump decrement input through said first selecting mechanism and to said second charge pump decrement input through said second selecting mechanism; and wherein said second phase detector increment signal is coupled to said second charge pump increment input through said second selecting mechanism and to said first charge pump decrement input through said first selecting mechanism and wherein said second phase detector decrement signal is coupled to said second charge pump decrement input through said second selecting mechanism and to said first charge pump increment input through said first selecting mechanism.

8. A method for switching a phase-locked clock signal from a first frequency to a second frequency without a disruption in the phase lock of said clock signal, the method comprising the steps of:

a) providing a phase-locked loop system, said phase-locked loop system outputting a system output signal, said phase-locked loop system including:

a first phase detector comparing the phase of a first input and a second input, said first phase detector outputting a first phase difference signal in proportion to detected phase difference;

a first oscillator outputting a first signal;

a second phase detector comparing the phase of a first input and a second input, said second phase detector outputting a second phase difference signal in proportion to detected phase difference;

second oscillator outputting a second signal;

first selecting mechanism, said first selecting mechanism receiving said first phase difference signal and said second phase difference signal and passing a first selected phase difference signal to said first oscillator;

a second selecting mechanism, said second selecting mechanism receiving said first phase difference signal and said second phase difference signal and passing a second selected signal to said second oscillator;

a first frequency divider, said first frequency divider receiving said first signal and outputting a divided first signal;

a second frequency divider, said second frequency divider receiving said second signal and outputting a divided second signal a third selecting mechanism, said third selecting mechanism receiving said divided first signal and said divided second signal and outputting a selected divided signal, wherein said selected divided signal is coupled to said system output;

b) switching said first selecting mechanism such that said first selecting mechanism passes said second selected phase difference signal to said first oscillator;

c) switching said second selecting mechanism such that said second selecting mechanism passes said first selected phase difference signal to said second oscillator; and d) switching said third selecting mechanism.

9. The method of claim 8 wherein the steps of switching said first selecting mechanism, switching said second selecting mechanism and switching said third selecting mechanism are preformed substantially simultaneously and when said first divided signal and said second divided signal are phase-aligned.

10. The method of claim 8 wherein said phase-locked loop system further includes:

a third frequency divider, said third frequency divider receiving said first signal and outputting a second divided first signal;

a fourth frequency divider, said fourth frequency divider receiving said second signal and outputting a second divided second signal; and a fourth selecting mechanism, said fourth selecting mechanism receiving said second divided first signal and said second divided second signal and outputting a second selected divided signal, said second selected divided signal coupled to a second system output and fed back to said first phase detector;

and wherein the method further comprises the step of switching said fourth selecting mechanism.

11. A phase-locked loop system, said phase lock-loop system providing a system output signal having a frequency and capable of switching said frequency without disrupting the phase lock of said system output signal, said phase-locked loop system comprising:

a) a first phase detector comparing the phase of a first input and a second input, said first phase detector outputting a first phase difference signal in proportion to detected phase difference;

b) a first oscillator outputting a first signal;

d) a second phase detector comparing the phase of a first input and a second input, said second phase detector outputting a second phase difference signal in proportion to detected phase difference;

c) a second oscillator outputting a second signal;

e) a first selecting mechanism, said first selecting mechanism receiving said first phase difference signal and said second phase difference signal and passing a first selected phase difference signal to said first oscillator;

f) a second selecting mechanism, said second selecting mechanism receiving said first phase difference signal and said second phase difference signal and passing a second selected signal to said second oscillator;

g) a first frequency divider, said first frequency divider receiving said first signal and outputting a first divided first signal;

h) a second frequency divider, said second frequency divider receiving said second signal and outputting a first divided second signal;

i) a third selecting mechanism, said third selecting mechanism receiving said first divided first signal and said first divided second signal and outputting a selected divided signal, wherein said selected divided signal is coupled to said system output and fed back to said first phase detector;

j) a third frequency divider, said second frequency divider receiving said first signal and outputting a second divided first signal;

k) a fourth frequency divider, said fourth frequency divider receiving said second signal and outputting a second divided second signal; and l) a fourth selecting mechanism, said fourth selecting mechanism receiving said second divided first signal and said second divided second signal and outputting a second selected divided signal.

12. The system of claim 11 further comprising a first charge pump having an increment input and a decrement input and having a an output coupled to said first oscillator;

a second charge pump having an increment input and a decrement input and having an output coupled said second oscillator;

wherein said first phase detector includes an increment output signal and decrement output signal;

wherein said second phase detector includes an increment output signal and decrement output signal;

wherein said first phase detector increment signal is coupled to said first charge pump increment input through said first selecting mechanism and to said second charge pump increment input through said second selecting mechanism and wherein said first phase detector decrement signal is coupled to said first charge pump decrement input through said first selecting mechanism and to said second charge pump decrement input through said second selecting mechanism; and wherein said second phase detector increment signal is coupled to said second charge pump increment input through said second selecting mechanism and to said first charge pump decrement input through said first selecting mechanism and wherein said second phase detector decrement signal is coupled to said second charge pump decrement input through said second selecting mechanism and to said first charge pump increment input through said first selecting mechanism.

13. A processing system comprising a) a processor operating at a first clock speed in response to a first variable-speed clock generator providing a first clock signal at the first clock speed to the processor, wherein the first variable-speed clock generator comprises a first phase-locked loop and wherein the first variable-speed clock generator comprises a first oscillator and a first phase detector outputting a first phase difference signal;

b) a second variable-speed clock generator generating a second clock signal at a preselected second clock speed, wherein the second variable-speed clock generator comprises second phase-locked loop and wherein the second variable-speed clock generator comprises a second oscillator and a second phase detector outputting a second phase difference signal; and c) means for switching the processor from the first clock signal at the first clock speed to the second clock signal at the second clock speed at a moment when an edge of the first clock signal and an edge of the second clock signal are aligned so that the processor continues operating uninterrupted at the second clock speed wherein the means for switching comprises a first selecting mechanism receiving the first clock signal and the second clock signal and wherein the means for switching further comprises a second selecting mechanism and a third selecting mechanism, the second selecting mechanism receiving said first phase difference signal and said second phase difference signal and passing a first selected phase difference signal to said first oscillator and the third selecting mechanism receiving said first phase difference signal and said second phase difference signal and passing a second selected phase difference signal to said second oscillator.

14. The phase-locked loop system of claim 13 wherein said first, second and third selecting mechanisms comprise multiplexers.

\* \* \* \* \*